(12) United States Patent
Ashtekar et al.

(10) Patent No.: US 9,753,088 B2
(45) Date of Patent: Sep. 5, 2017

(54) PORTABLE DIAGNOSTIC APPARATUS FOR TESTING CIRCUIT BREAKERS

(71) Applicant: EATON CORPORATION, Cleveland, OH (US)

(72) Inventors: Koustubh Dnyandeo Ashtekar, Moon Township, PA (US); James Jeffery Benke, Pittsburgh, PA (US); Greg D. Holland, Oakdale, PA (US)

(73) Assignee: EATON CORPORATION, Cleveland, OH (US)

( * ) Notice: Subject to any disclaimer, the term of this patent is extended or adjusted under 35 U.S.C. 154(b) by 298 days.

(21) Appl. No.: 14/531,502

(22) Filed: Nov. 3, 2014

(65) Prior Publication Data

US 2016/0124048 A1 May 5, 2016

(51) Int. Cl.
*G01R 31/02* (2006.01)
*G01R 31/327* (2006.01)
(Continued)

(52) U.S. Cl.
CPC .......... *G01R 31/3272* (2013.01); *G01R 27/20* (2013.01); *G01R 31/3274* (2013.01);
(Continued)

(58) Field of Classification Search
CPC ............ G01R 31/3274; G01R 31/3278; G01R 31/3272; G01R 31/3333; G01R 31/3336; G01R 27/20; H01H 1/0015
(Continued)

(56) References Cited

U.S. PATENT DOCUMENTS 3,742,304 A * 6/1973 Elder ...................... G04F 10/00
361/198
4,105,965 A * 8/1978 Russell .............. G01R 31/3277
324/424
(Continued)

FOREIGN PATENT DOCUMENTS

BE WO 2012037948 A1 * 3/2012 ......... G01R 31/3333
BE EP 2619601 A1 * 7/2013 ......... G01R 31/3333
(Continued)

OTHER PUBLICATIONS

Ametek, BT-100 Circuit Breaker Tester, Ametek, Inc. Copyright 2002.*

(Continued)

*Primary Examiner* — Patrick Assouad
*Assistant Examiner* — Sean Curtis
(74) *Attorney, Agent, or Firm* — Eckert Seamans; Philip Levy; Grant Coffield

(57) ABSTRACT

A portable diagnostic apparatus for performing diagnostic testing on a circuit breaker includes a number of sensor devices structured to generate a number of sensed parameter signals relating to operation of the circuit breaker during an operational sequence, a number of auxiliary input connectors structured to receive a number of auxiliary data signals from the circuit breaker, the number of auxiliary data signals relating to and being generated in response to the operation of the circuit breaker during the operational sequence, and control and diagnostic circuitry. The control and diagnostic circuitry is structured to control operation of the portable diagnostic apparatus, receive the number of sensed parameter signals and the number of auxiliary data signals, and generate a time signature based on the number of sensed parameter signals and the number of auxiliary data signals.

17 Claims, 4 Drawing Sheets

(51) Int. Cl.
  *G01R 31/333* (2006.01)
  *G01R 27/20* (2006.01)
  *H01H 1/00* (2006.01)
(52) U.S. Cl.
  CPC ...... *G01R 31/3278* (2013.01); *G01R 31/3333* (2013.01); *G01R 31/3336* (2013.01); *H01H 1/0015* (2013.01)
(58) Field of Classification Search
  USPC ...... 324/415–424, 555; 361/1, 42, 102, 109, 361/114, 115, 179
  See application file for complete search history.

(56) References Cited

U.S. PATENT DOCUMENTS

| | | | | |
|---|---|---|---|---|
| 4,128,804 A * | 12/1978 | Russell | G01R 31/02 | 324/424 |
| 4,998,067 A * | 3/1991 | Puckett | G01R 31/3277 | 324/424 |
| 5,270,658 A * | 12/1993 | Epstein | G01R 31/3272 | 324/424 |
| 5,705,968 A | 1/1998 | Beck et al. | | |
| 5,710,513 A * | 1/1998 | March | G01R 31/3277 | 324/424 |
| 6,545,479 B1 * | 4/2003 | Dollar, II | G01R 31/3274 | 324/424 |
| 6,744,260 B2 * | 6/2004 | Schmalz | G01R 31/3277 | 324/424 |
| 6,798,209 B2 * | 9/2004 | Lavoie | G01R 31/3277 | 324/424 |
| 6,850,072 B1 * | 2/2005 | Stanisic | G01R 31/3333 | 324/424 |
| 6,963,203 B2 * | 11/2005 | Stanisic | G01R 31/3272 | 324/423 |
| 7,057,401 B2 * | 6/2006 | Blades | G01R 31/041 | 324/424 |
| 7,268,558 B2 * | 9/2007 | Mills | G01R 31/3277 | 324/424 |
| 7,403,015 B2 * | 7/2008 | Carlino | H02H 1/06 | 324/424 |
| 8,006,371 B1 * | 8/2011 | Ledbetter | H02B 3/00 | 29/622 |
| 8,228,225 B1 * | 7/2012 | Ledbetter | H02B 3/00 | 200/50.24 |
| 8,466,584 B1 * | 6/2013 | Ledbetter | H01H 3/26 | 307/125 |
| 9,086,447 B1 * | 7/2015 | Ledbetter, III | G01R 31/2827 | |
| 2003/0132753 A1 * | 7/2003 | Lavoie | G01R 31/3277 | 324/424 |
| 2004/0012393 A1 * | 1/2004 | Schmalz | G01R 31/3277 | 324/424 |
| 2004/0189307 A1 * | 9/2004 | Rudholm | G01R 31/3274 | 324/421 |
| 2004/0189319 A1 * | 9/2004 | Stanisic | G01R 31/3272 | 324/523 |
| 2005/0110501 A1 * | 5/2005 | Walker | G01R 31/3272 | 324/536 |
| 2006/0176630 A1 * | 8/2006 | Carlino | H02H 1/0061 | 361/64 |
| 2007/0047161 A1 * | 3/2007 | Mills | G01R 31/3277 | 361/42 |
| 2008/0084213 A1 * | 4/2008 | Waite | G01R 31/3277 | 324/424 |
| 2008/0157776 A1 * | 7/2008 | Jaffer | H01H 71/123 | 324/424 |
| 2010/0025202 A1 | 2/2010 | Mittu et al. | | |
| 2013/0300423 A1 * | 11/2013 | Klapper | G01R 31/3272 | 324/424 |
| 2015/0070020 A1 * | 3/2015 | Michaux | H01H 9/167 | 324/424 |
| 2016/0124048 A1 * | 5/2016 | Ashtekar | G01R 31/3272 | 324/424 |

FOREIGN PATENT DOCUMENTS

| | | | | |
|---|---|---|---|---|
| BE | EP 2619601 B1 * | 11/2014 | ......... | G01R 31/3333 |
| BE | ES 2530052 T3 * | 2/2015 | ......... | G01R 31/3333 |
| CN | 103109199 A * | 5/2013 | ......... | G01R 31/3333 |
| CN | 103109199 B * | 12/2015 | ......... | G01R 31/3333 |

OTHER PUBLICATIONS

Vacuum Interrupters, Inc., "Vacuum Interrupter Tester—Vacuum Bottle Tester", http://vacuuminterruptertesting.com/, 2011-2014, 1 p.

Vacuum Interrupters, Inc., "Vacuum Interrupter Tester—Vacuum Bottle Tester", http://vacuuminterruptertesting.com/vacuum-interrupter-test-set.htm, 2011-2014, 2 pp.

Vacuum Interrupters, Inc., "Circuit Breaker Timer Interface Unit", http://vacuuminterruptertesting.com/circuit-breaker-timer-interface.htm, 2011-2014, 1 p.

Vacuum Interrupters, Inc., "Circuit Breaker Timer", http://vacuuminterruptertesting.com/circuit-breaker-timer.htm, 1 p.

* cited by examiner

PORTABLE DIAGNOSTIC APPARATUS FOR TESTING CIRCUIT BREAKERS

BACKGROUND

Field

The disclosed concept pertains generally to circuit breakers used in power transmission and distribution systems, and, more particularly, to a portable diagnostic apparatus including an onboard diagnostic feature for performing diagnostic testing on circuit breakers, such as, without limitation, low or high voltage power circuit breakers.

Background Information

Electrical power transmission and distribution systems typically utilize a plurality of power circuit breakers which include one or more sets of separable contacts for protecting circuits against overcurrent conditions. In the field, a number of such circuit breakers are generally mounted and housed within a non-conductive housing or enclosure, often referred to as a switchgear enclosure. Power connections for the circuit breakers are generally terminated in the rear of the enclosure, and instrumentation and control terminal blocks for the circuit breakers may either be mounted in the rear or the front of the enclosure. In many cases, switchgear equipment as just described is provided in a drawout configuration wherein the circuit breakers may be completely removed from the front of the switchgear enclosure for repair, testing or maintenance. On other cases, the circuit breakers are mounted on customized framework, generally called a fixed breaker, and may not be able to racked out of the framework.

The electrical power transmission and distribution industry has a huge installed-base of power circuit breakers. Many of the circuit breakers have been in the field for a long time and are still completely operational. These older circuit breakers, unlike many more modern circuit breakers, do not have any built-in diagnostic sensors for monitoring the operation thereof. If such a circuit breaker fails, the customer typically immediately replaces the failed circuit breaker with a spare circuit breaker available on site, and transfers the failed circuit breaker to a remote maintenance site for diagnostic testing and repair.

Many of the circuit breakers in the electrical power and distribution industry are what are known as drawout circuit breakers. Drawout circuit breakers often include a mechanism for moving the breaker in and connecting the breaker to corresponding electrical contacts, a location known as the "racked-in" position. When in the racked-in position, the circuit breaker is coupled to the main electrical circuit and provides the interruption functionality for which it is intended. If the drawout mechanism is activated to the "racked-out" position, the circuit breaker is disconnected from the electrical contacts and the main electrical circuit. The circuit breaker may be moved to the racked-out position, for example, when maintenance is performed on the main electrical circuit. Typical racking mechanisms often include a third or "test" position in between the "racked in" or "Connected" position and "Racked out" or "Disconnected" position. In the test position the circuit breaker can be closed, opened or tripped in order to check the functionality of the circuit breaker by evaluating proper operation of the internal and external accessories such as auxiliary switches, shunt trip and under voltage and secondary circuits.

Diagnostic testing and repair at such a remote maintenance site often makes the diagnosis of the real problem more difficult, since the circuit breaker will often have to be tested without electrical control power due to the unavailability of a proper fixture such as switchgear enclosure, testing cabinet, etc. In addition, on-call service Engineers or maintenance staff at the customer's site may face problems understanding the breaker mechanism and may not be able to repair the issue due to lack of knowledge and/or sensor diagnostic data. Thus, there is a need for a diagnostic device that can easily and readily interact with the circuit breaker, under drawout or fixed configurations, as discussed above, and provide onboard diagnostic information. In the case of a drawout breaker, it is also often necessary to analyze the breaker functioning under switchgear control signals, giving rise to at least three modes of diagnostic protocol, including, but not limited to, ONLINE mode, Semi-Online mode and Offline mode.

Further, the time constrains at maintenance shops due to the cost associated with the downtime or maintenance itself are critical. This creates a need for quick guidance as to the appropriate and accurate repair instructions further to the on board diagnostic indications. This is needed to further improve the service efficiency for the breaker failure event. This requires an automated diagnostic and repair methodology to be implemented in the new portable device that can be used at the customer's site.

SUMMARY

In one embodiment, a portable diagnostic apparatus is provided for performing diagnostic testing on a circuit breaker. The portable diagnostic apparatus includes a number of sensor devices structured to generate a number of sensed parameter signals relating to operation of the circuit breaker during an operational sequence, a number of auxiliary input connectors structured to receive a number of auxiliary data signals from the circuit breaker, the number of auxiliary data signals relating to and being generated in response to the operation of the circuit breaker during the operational sequence, and control and diagnostic circuitry. The control and diagnostic circuitry is structured to control operation of the portable diagnostic apparatus, receive the number of sensed parameter signals and the number of auxiliary data signals, and generate a time signature based on the number of sensed parameter signals and the number of auxiliary data signals.

In another embodiment, a method of performing diagnostic testing on a circuit breaker is provided. The method includes causing the circuit breaker to perform an operational sequence, employing a portable diagnostic apparatus coupled to the circuit breaker to generate a number of sensed parameter signals relating to operation of the circuit breaker during the operational sequence, receiving in the portable diagnostic apparatus a number of auxiliary data signals from the circuit breaker, the number of auxiliary data signals relating to and being generated in response to the operation of the circuit breaker during the operational sequence, and generating in the portable diagnostic apparatus a time signature based on the number of sensed parameter signals and the number of auxiliary data signals.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1:
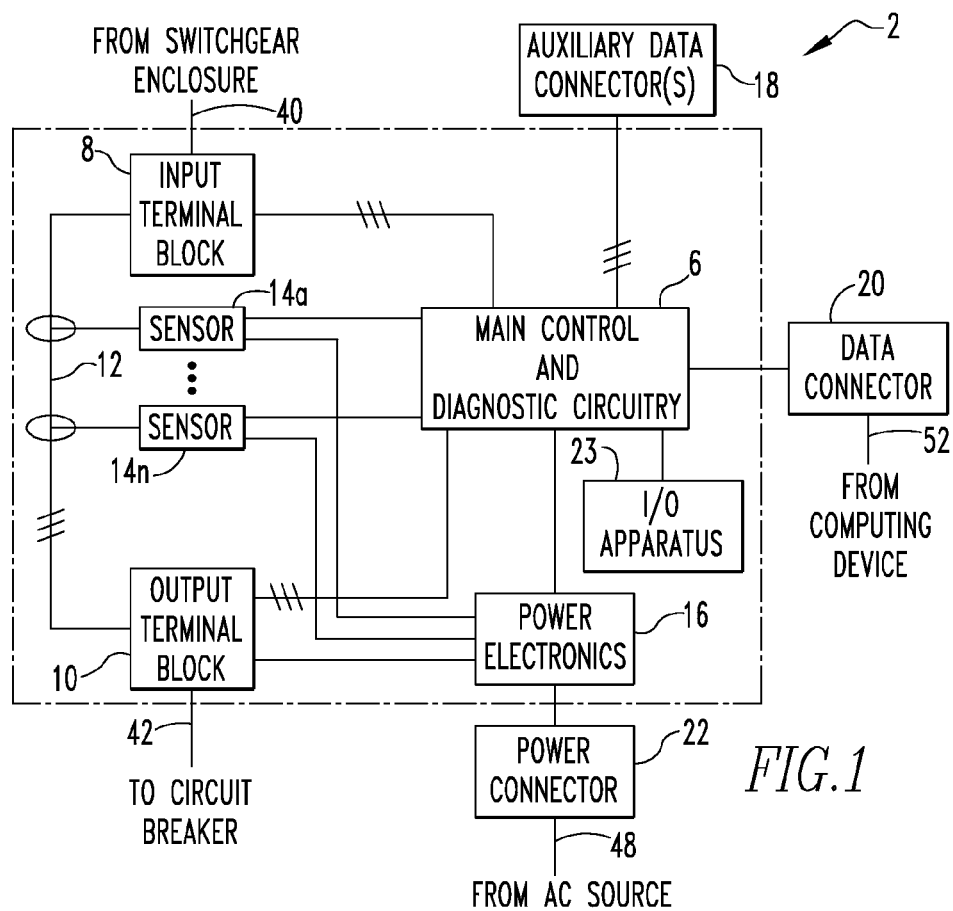
FIG. 1 is a schematic diagram of a portable diagnostic apparatus according to exemplary embodiment of the disclosed concept.

Directional phrases used herein, such as, for example, left, right, front, back, top, bottom and derivatives thereof, relate to the orientation of the elements shown in the drawings and are not limiting upon the claims unless expressly recited therein.

As employed herein, the term "number" shall mean one or an integer greater than one.

As employed herein, the statement that two or more parts are "coupled" together shall mean that the parts are joined together either directly or joined through one or more intermediate parts.

As employed herein, the term "time signature" shall mean a visual representation of a number of waveforms each indicating a time sensitive parameter relating to the operation of a circuit breaker or switchgear/cell and/or the data that may be used to represent, render or otherwise generate such a visual representation.

A circuit breaker has its own working logic, which is implemented electro-mechanically using an interlock mechanism, separable contacts and actuators such as a motor, close-open coils, etc. These components have very specific time-dependent relations with respect to each other. This working logic can be obtained and represented as a time signature for the circuit breaker. Whether operated mechanically or electrically, proper operation of a circuit breaker will result in a "normal" time signature having a certain, predetermined format. Time signatures that deviate from this "normal" format can be indicative of certain issues with the operation of the circuit breaker that may have caused or will eventually cause certain failure mode(s). Thus, a properly acquired time signature for a circuit breaker may be used to provide diagnostic input to a service engineer to assist with the diagnostic process.

As described in greater detail herein, the disclosed concept provides a portable diagnostic apparatus that may be used to perform diagnostic testing on a circuit breaker by acquiring/generating a time signature for the circuit breaker. As also described in greater detail herein, the portable diagnostic apparatus may be used: "on-site" at the site wherein the circuit breaker is normally installed, e.g., in a switchgear enclosure, in an online or automatic mode of operation wherein the circuit breaker is electrically operated via locally generated or remotely generated switchgear control signals, or "off-site" at, for example, a remote maintenance site, in modes wherein the circuit breaker may be electrically operated in a manner that simulates switchgear control or manually operated.

Figure 2:
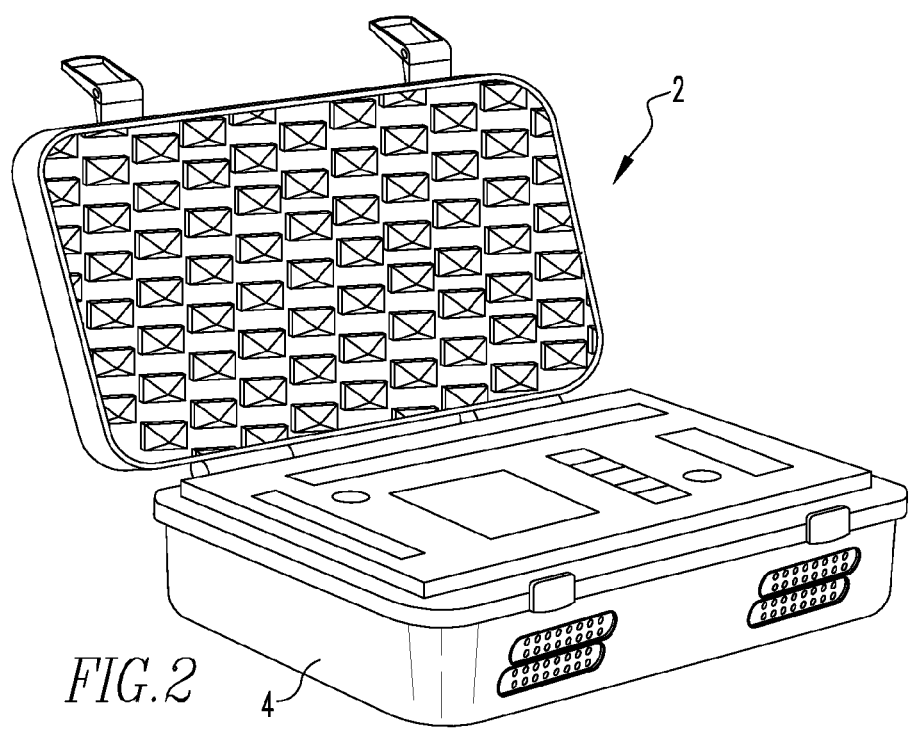
FIG. 2 is an isometric view of a portable diagnostic apparatus according to one particular, non-limiting exemplary embodiment.

FIG. 1 is a schematic diagram of a portable diagnostic apparatus 2 according to an exemplary embodiment of the disclosed concept. In one particular, non-limiting exemplary embodiment, diagnostic apparatus 2 is provided in the form of a portable diagnostic box as shown in FIG. 2 that, to facilitate traveling, is the size of an acceptable airline carry-on baggage with a strong, rigid and bounce resistant cover 4. In FIG. 1, the dotted line shows the boundary where all of the wired connections to diagnostic apparatus 2 will be made as described herein.

As seen in FIG. 1, diagnostic apparatus 2 includes main control and diagnostic circuitry 6. In one aspect, main control and diagnostic circuitry 6 includes a processor apparatus/module that includes a processor and a memory. The processor may be, for example and without limitation, a microprocessor, a microcontroller, or some other suitable processing device or circuitry, that interfaces with the memory. The memory can be any of one or more of a variety of types of internal and/or external storage media such as, without limitation, RAM, ROM, EPROM(s), EEPROM(s), FLASH, and the like that provide a storage register, i.e., a machine readable medium, for data storage such as in the fashion of an internal storage area of a computer, and can be volatile memory or nonvolatile memory. The memory forming part of main control and diagnostic circuitry 6 has stored therein a number of routines that are executable by the processor. One or more of the routines implement a system for controlling the operation of diagnostic apparatus 2 as described herein. In another aspect, main control and diagnostic circuitry 6 includes diagnostic circuitry that is structured and configured to receive a number of inputs relating to the operation of a circuit breaker from the outside enclosure such as switchgear or cell and to generate a time signature based on the received input information. As described herein, that time signature may then be used to diagnose issues relating to the operation of the circuit breaker.

Diagnostic apparatus 2 further includes an input terminal block 8 and an output terminal block 10. Input terminal block 8 is structured to enable a number of input connections to be made to diagnostic apparatus 2. Output terminal block 10 is structured to enable a number of output connections to be made to diagnostic apparatus 2 so that output signals can be provided from diagnostic apparatus 2 to another device. Input terminal block 8 and output terminal block 10 are electrically connected to main control and diagnostic circuitry 8 such that certain input signals can be routed from input terminal block 8 to main control and diagnostic circuitry 6 and certain output signals can be routed from main control and diagnostic circuitry 6 to output terminal block 10 as needed. In addition, a number of electrical connections 12 are provided between input terminal block 8 and output terminal block 10 so that certain signals can be passed from input terminal block 8 to output terminal block 10 directly as needed.

Diagnostic apparatus 2 also includes a number of sensor devices 14. Each sensor device 14 is structured to measure a parameter, such as a current and/or a voltage, that is present on one of the electrical connections 12. For example, and without limitation, a sensor device 14 may be a Rogowski coil or a Hall effect sensor for measuring current or a voltage measuring apparatus. Each sensor device 14 is also operatively coupled to main control and diagnostic circuitry 6 such that the output of the sensor device 14 can be provided to main control and diagnostic circuitry 6.

Diagnostic apparatus 2 includes power electronics module 16 structured to provide various types of power functionality for diagnostic apparatus 2. Power electronics module 16 may contain, for example and without limitation, step up/down transformers, signal conditioning circuitry, rectifying circuitry, a pulsating power generator, and frequency modulation circuitry. The power functionality provided by power electronics module 16 may include providing DC or AC power for powering the various electronic components of diagnostic apparatus 2. The power functionality provided by power electronics module 16 may also include generating power and control signals that simulate the power and control signals of a switchgear that, in certain embodiments described herein, are provided to a circuit breaker to electrically control and operate the circuit breaker, including any number of circuit breaker accessory devices such as, without limitation, a spring charging motor, a spring release device, a shunt trip device, and/or an undervoltage release device. The significance of this functionality is described in detail elsewhere herein. A power connector 22 is also provided as part of diagnostic apparatus 2 and is coupled to power electronics module 16. Power connector 22 is provided to enable power electronics module 16 to receive AC power from a local source, such as, for example and without limitation, a wall outlet.

Diagnostic apparatus 2 further includes a number of auxiliary data connectors 18 that are operatively coupled to main control and diagnostic circuitry 6. The auxiliary data connectors 18 are structured to enable one or more input electrical signals to be provided to main control and diagnostic circuitry 6 from another device. Such data inputs are useful for measuring the performance of the circuit breaker elements, such as those that are not directly or indirectly connected to switchgear or an external control cell. Such elements are used only internally to the circuit breaker, for example, but not limited to, a motor cutoff switch, various internal limit switches, etc. In addition, a data connector 20, which may enable wired and/or wireless connections, such as, but not limited to, a standard USB connector, Ethernet, CAN BUS, DIN, RJ45, or blue tooth, WiFi, NFS etc, is provided in order to enable main control and diagnostic circuitry 6 to output data, such as a time signature, to a device such as, without limitation, a laptop computer, a tablet computer, or a smartphone.

Finally, diagnostic apparatus 2 includes I/O apparatus 23 which may include various types of devices for inputting information into diagnostic apparatus 2 and/or outputting information from diagnostic apparatus 2. Such devices may include various switches and buttons to control various aspects of diagnostic apparatus 2 and/or various visual display devices, such as LEDs or LCD displays, for enabling diagnostic apparatus 2 to output certain information as described herein to a user.

As noted elsewhere herein, diagnostic apparatus 2 may be operated in either an on-site, online or automatic mode of operation at the site wherein the circuit breaker being tested is normally installed with the circuit breaker being operated via switchgear control, or in a number of off-site modes wherein the circuit breaker being tested being operated such that it is controlled electrically via signals that simulate switchgear control or manually. Particular non-limiting, exemplary implementations of these modes of operation will now be described.

Figure 3:
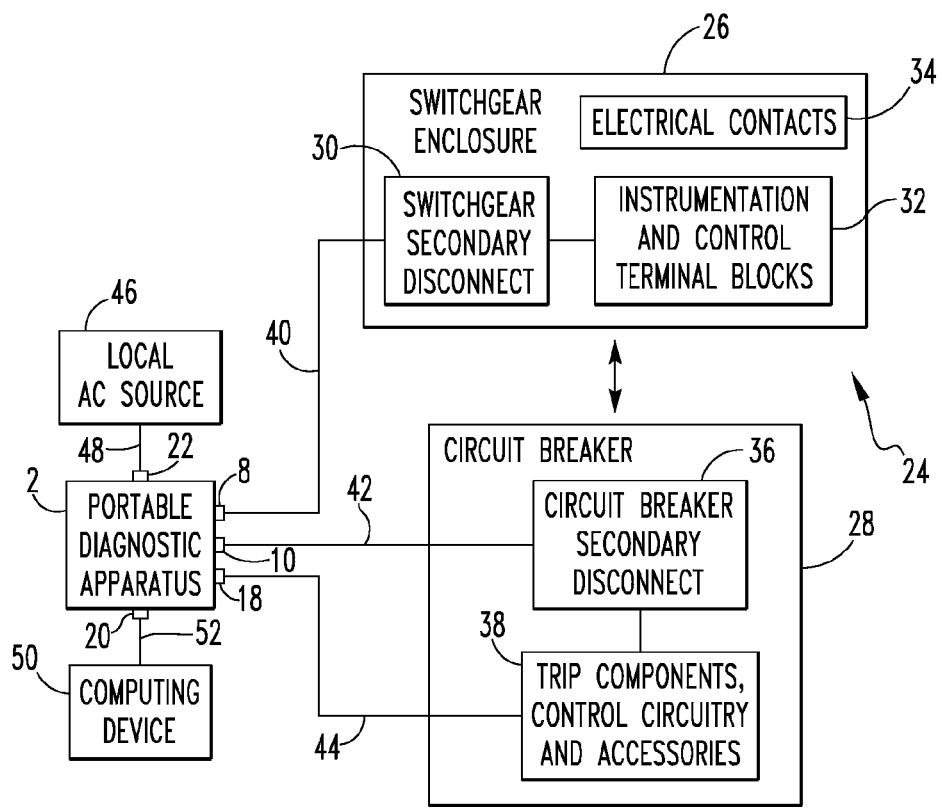
FIG. 3 is a schematic diagram illustrating operation of the diagnostic apparatus of FIG. 1 in the on-site mode for performing diagnostic testing on a drawout circuit breaker assembly according to one exemplary embodiment.

FIG. 3 is a schematic diagram illustrating operation of diagnostic apparatus 2 in the on-site mode for performing diagnostic testing on a drawout switchgear assembly 24 including a switchgear enclosure 26 which houses a circuit breaker 28 in a manner wherein the circuit breaker 28 may be selectively drawn out of switchgear enclosure 26. As is known in the art, drawout switchgear assembly 24 includes a mechanism for selectively moving the circuit breaker 28 among racked-in, racked-out and test positions, as described elsewhere herein. It will be understood, however, that description herein including drawout switchgear assembly 24 is exemplary only, and that the disclosed concept may be employed with other types of circuit breaker implementations such as, without limitation, a fixed type circuit breaker.

As seen in FIG. 3, switchgear enclosure 26 includes a switchgear secondary disconnect 30 which is coupled to instrumentation and control terminal blocks 32. Switchgear enclosure 26 also includes electrical contacts 34 structured to enable electrical connections to be made to an AC power source and a load. As will be appreciated, in drawout switchgear assembly 24, circuit breaker 28 is structured and configured to provide circuit protection functionality to the attached load. As also seen in FIG. 3, circuit breaker 28 includes circuit breaker secondary disconnect 36 which is structured to be in electrical connection with switchgear secondary disconnect 30 when switchgear assembly 24 is in the racked-in position. Circuit breaker 28 also includes various trip components, control circuitry and accessories, indicated at reference numeral 38, which may include the mechanism for automatically tripping circuit breaker 28, a number of circuit breaker accessories, such as, without limitation, a spring charging motor, a spring release device, a shunt trip device, and/or an undervoltage release device, and associated control electronics, such as an electronic trip unit. Switchgear secondary disconnect 30 is operatively coupled to a control center which, during normal operation of switchgear assembly 24, generates power and control signals for operating switchgear assembly 26. Thus, when switchgear secondary disconnect 30 and circuit breaker secondary disconnect 36 are coupled to one another in the racked-in condition, signals generated by the control center may be provided to trip components, control circuitry and accessories 38 through switchgear secondary disconnect 30 and circuit breaker secondary disconnect 36. Such signals may include, for example and without limitation, signals for controlling a spring charging motor, a spring release device, a number of shunt trip devices, or an overvoltage release device, and/or signals for controlling the opening and closing of the separable contacts of circuit breaker 28 by any other suitable means.

Figure 4:
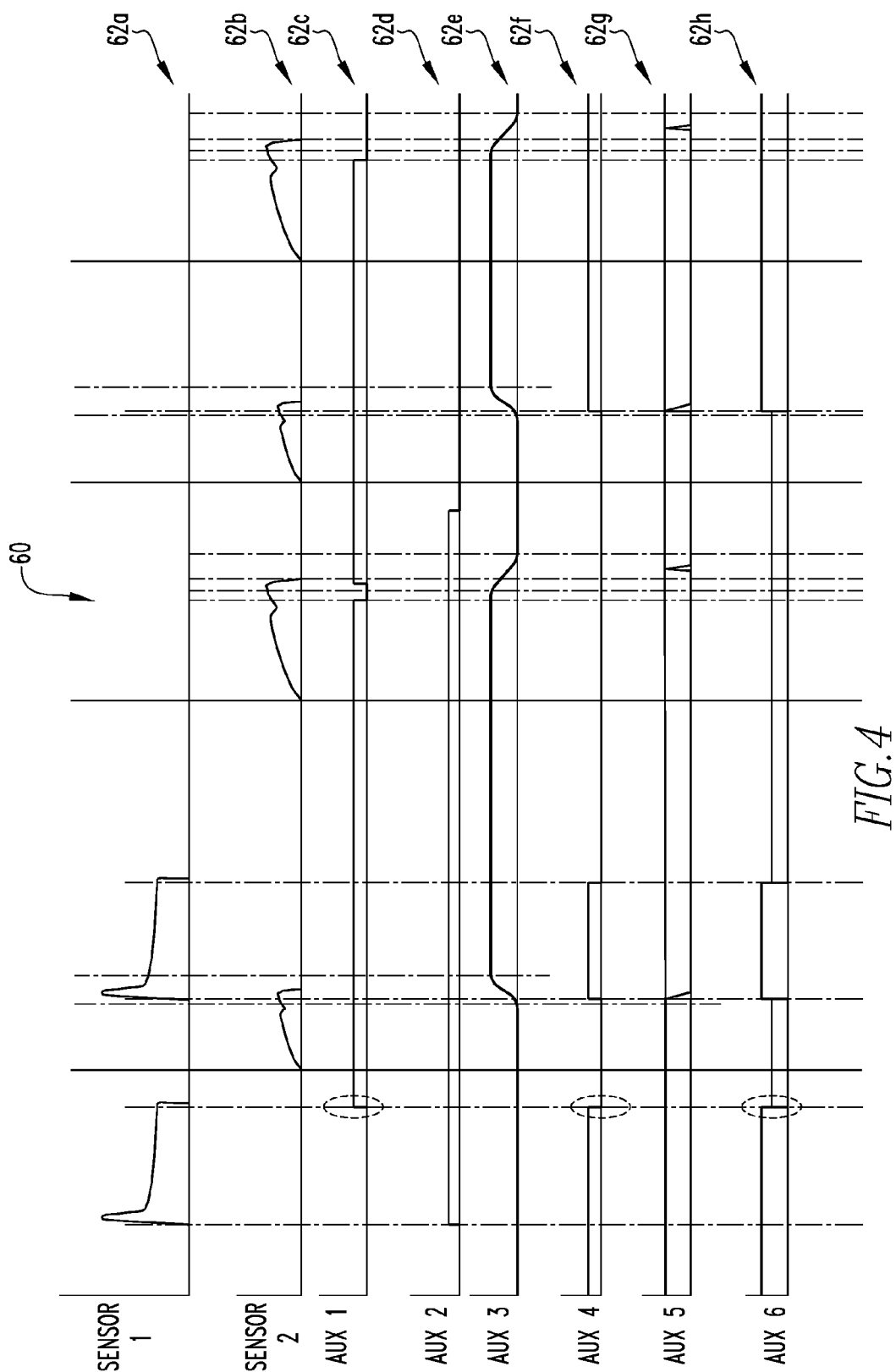
FIG. 4 is a schematic diagram illustrating operation of the diagnostic apparatus of FIG. 1 in the on-site mode for performing diagnostic testing on a power circuit breaker according to one exemplary embodiment.

As noted elsewhere herein, main control and diagnostic circuitry 6 of diagnostic apparatus 2 is structured and configured to receive a number of inputs relating to the operation of a circuit breaker, such as a circuit breaker 28, and to generate a time signature based on the received input information. In particular, according to an aspect of the disclosed concept and in accordance with the exemplary embodiment shown in FIGS. 1-3, the time signature related inputs may be provided to main control and diagnostic circuitry 6 from a number of the sensor devices 14 and/or from circuit breaker 28 through auxiliary data connectors 18 in response to circuit breaker 28 being subjected to a particular operational sequence. FIG. 4 is a schematic representation of an exemplary time signature 60 that may be generated by main control and diagnostic circuitry 6 in response to a particular operational sequence of circuit breaker 28.

As seen in FIG. 4, time signature 60 includes a number of time dependent waveforms $62a$-$62h$ each indicating a time sensitive parameter relating to the operation of circuit breaker 28 during the operational sequence. In the non-limiting, illustrated exemplary embodiment, waveforms 62a and 62b are based on the output of two sensor devices 14 and waveforms 62c-62h are based on data received through auxiliary data connectors 18 from circuit breaker 28. It will be appreciated, however, that this is meant to be exemplary only, and that the waveforms 62 comprising time signature 60 may differ. For example, waveforms 62a-62d may be based on the output of sensor devices 14 with the remaining waveforms, 62e-62h, being based on data received through auxiliary data connectors 18, and so on. In one particular, non-limiting exemplary embodiment, waveform 62a is based on and represents the current of a spring charging motor provided as part of circuit breaker 28 as measured by one of the sensor devices 14 in the form of a current sensor, waveform 62b is based on and represents the current of a solenoid coil provided as part of circuit breaker 28 as measured by another one of the sensor devices 14 also in the form of a current sensor, and waveforms 62c-62h are based on and represent the following digital data received through auxiliary data connectors 18 from circuit breaker 28, respectively: contact-LC, contact-PS2, contact travel, contact LS1, auxiliary contact, and contact LS2. In addition, the operational sequence used to generate the time signature 60 may be any of a number of operational sequences, such as, without limitation, a CHARGE-CLOSE-CHARGE-OPEN-CLOSE-OPEN sequence, wherein CHARGE indicates the charging or compression of the closing springs of circuit breaker 28, CLOSE indicates the closing of the separable contacts of circuit breaker 28, and OPEN indicates the opening of the separable contacts of circuit breaker 28. Other operational sequence may include, without limitation, CHARGE-OPEN-CLOSE and CHARGE-CLOSE-CHARGE-OPEN.

In operation, when it is desired to perform on-site diagnostic testing of circuit breaker 28, a service engineer will travel to the site with diagnostic apparatus 2. Once at the site, circuit breaker 28 is moved to the racked-out position. In this racked out position, switchgear secondary disconnect 30 will be disconnected from circuit breaker secondary disconnect 36. Diagnostic apparatus 2 is then operatively coupled in series between switchgear enclosure 26 and circuit breaker 28 by connecting switchgear secondary disconnect 30 to input terminal block 8 using cable assembly 40, connecting circuit breaker secondary disconnect 36 to output terminal block 10 using cable assembly 42, and connecting the trip components, control circuitry and accessories 38 to auxiliary data connectors 18 using cable assembly 44. In addition, a local AC source 46, such as a wall outlet, is connected to power connector 22 using cable assembly 48. Finally, a computing device 50, such as, without limitation, a laptop computer, a tablet computer, or a smart phone, is connected to data connector 20 using cabling 52.

Next, to perform the diagnostic testing, the service engineer will control operation of circuit breaker 28 using locally or remotely generated switchgear control signals as described elsewhere herein and cause circuit breaker 28 to be subjected to a particular operational sequence, such as, without limitation, the CHARGE-CLOSE-CHARGE-OPEN-CLOSE-OPEN sequence described above. During this operational sequence, main control and diagnostic circuitry 6 will collect the data that is used to generate the time signature as described above via one or more of the sensor devices 14 and via inputs provided through auxiliary data connectors 18. The time signature, once generated by main control and diagnostic circuitry 6, may then be output to computing device 50 through data connector 20 and cabling 52. Once received by computing device 50, the time signature may be displayed so that it can be viewed by the service engineer. In addition, computing device 50 may be provided with software which compares the received time signature to a stored, predetermined "normal" time signature for circuit breaker 28 in order to identify particular issues and/or failure modes. Furthermore, according to a particular embodiment, main control and diagnostic circuitry 6 may also be provided with software which is able to examine the generated time signature and identify particular failure modes therefrom. Once particular failure modes are identified, they may be displayed via I/O apparatus 23 provided as part of diagnostic apparatus 2, for example in the form of a failure code. The service engineer may then use the indicated failure code to consult an operational manual for circuit breaker 28 to determine the particular problem that corresponds to the indicated failure code.

Another advantage of the on-site, online mode just described is that a service engineer can also gauge the signal coming from the switchgear secondary disconnect 30. For example, if a breaker is designed to handle 125 VDC control voltage for the opening coil, but switchgear enclosure 26 and switchgear secondary disconnect 30 are providing 200 VDC via failed switchgear components, this would be a problem that a service engineer would be interested in and would need to address first, as this situation would change the opening time of the breaker.

Figure 5:
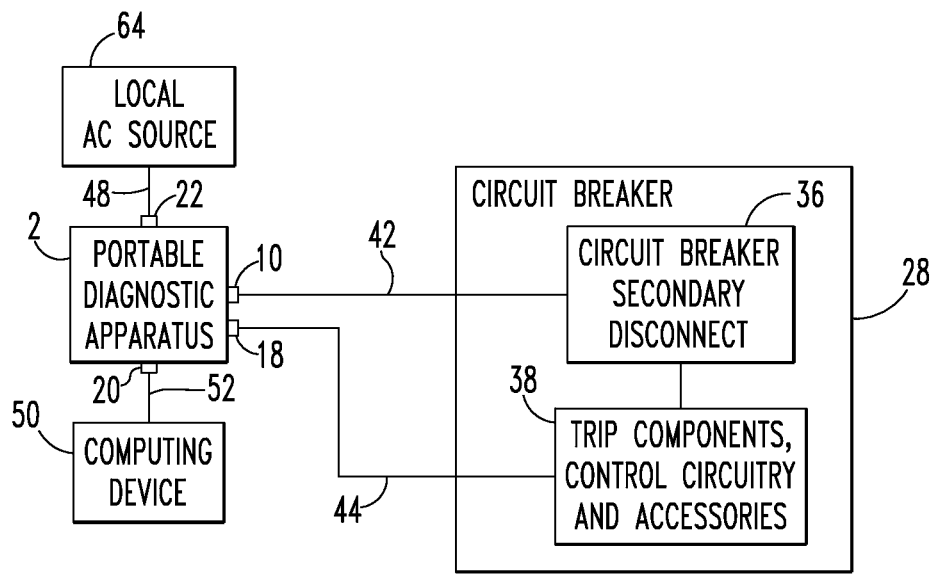
FIG. 5 is a schematic diagram illustrating operation of the diagnostic apparatus of FIG. 1 in the off-site mode for performing diagnostic testing on a circuit breaker according to one exemplary embodiment.

FIG. 5 is a schematic diagram illustrating operation of diagnostic apparatus 2 in the off-site mode for performing diagnostic testing on circuit breaker 28 wherein circuit breaker 28 has been removed from switchgear enclosure 26 and taken to a remote site for the diagnostic testing according to one particular exemplary embodiment. It will be understood that the illustration of circuit breaker 28 in FIG. 5 is meant to be exemplary only, and that other types of circuit breakers may also be tested in this manner according to an aspect of the disclosed concept.

In operation, when it is desired to perform off-site diagnostic testing of circuit breaker 28, a service engineer will remove the circuit breaker 28 from switchgear enclosure 26 and take it to the remote site. At the remote site, diagnostic apparatus 2 is operatively coupled to circuit breaker 28 by connecting circuit breaker secondary disconnect 36 to output terminal block 10 using cable assembly 42, and connecting the trip components, control circuitry and accessories 38 to auxiliary data connectors 18 using cable assembly 44. In addition, a local AC source 64, such as a wall outlet, is connected to power connector 22 using cable assembly 48. Finally, a computing device 50, such as, without limitation, a laptop computer, a tablet computer, or a smart phone, is connected to data connector 20 using cabling 52.

Next, to perform the diagnostic testing, the service engineer will control operation of circuit breaker 28 by causing control and diagnostic circuitry 6, in conjunction with power electronics 16, to generate power and control signals which simulate switchgear control signals. As will be appreciated, the service engineer may cause such signals to be generated using I/O apparatus 23 as described herein. The generated power and control signals are output to circuit breaker secondary disconnect 36 through output terminal block 16 and cause circuit breaker 28 to be subjected to a particular operational sequence, such as, without limitation, the CHARGE-CLOSE-CHARGE-OPEN-CLOSE-OPEN sequence described above. As described elsewhere herein, during this operational sequence, main control and diagnostic circuitry 6 will collect the data that is used to generate the time signature as described above via one or more of the sensor devices 14 and via inputs provided through auxiliary data connectors 18. The time signature, once generated by main control and diagnostic circuitry 6, may then be used as described in detail elsewhere herein to assist with the diagnostic testing of circuit breaker 28. The time signature in this mode of operation may look similar to time signature 60 shown in FIG. 4. Thus, operation of diagnostic apparatus 2 as just described represents the off-site mode with electrical control of circuit breaker 28.

According to an alternative embodiment, the configuration shown in FIG. 5 may be used to test a circuit breaker, such a circuit breaker 28, in an off-site mode wherein, rather than employing electrical control of circuit breaker 28, manual control of circuit breaker 28 is employed. In particular, in this embodiment, once diagnostic apparatus 2 is connected as shown in FIG. 5, the user can manually cause the circuit breaker to be subjected to a particular operational sequence, such as, without limitation, the CHARGE-CLOSE-CHARGE-OPEN-CLOSE-OPEN sequence described above, with the resulting time signature being generated as described herein. The time signature in this mode of operation may look similar to time signature 60 shown in FIG. 4, except that, since the circuit breaker 28 was manually controlled, the waveforms 62a and 62b that represent electrical breaker control signals will be absent.

Figure 6:
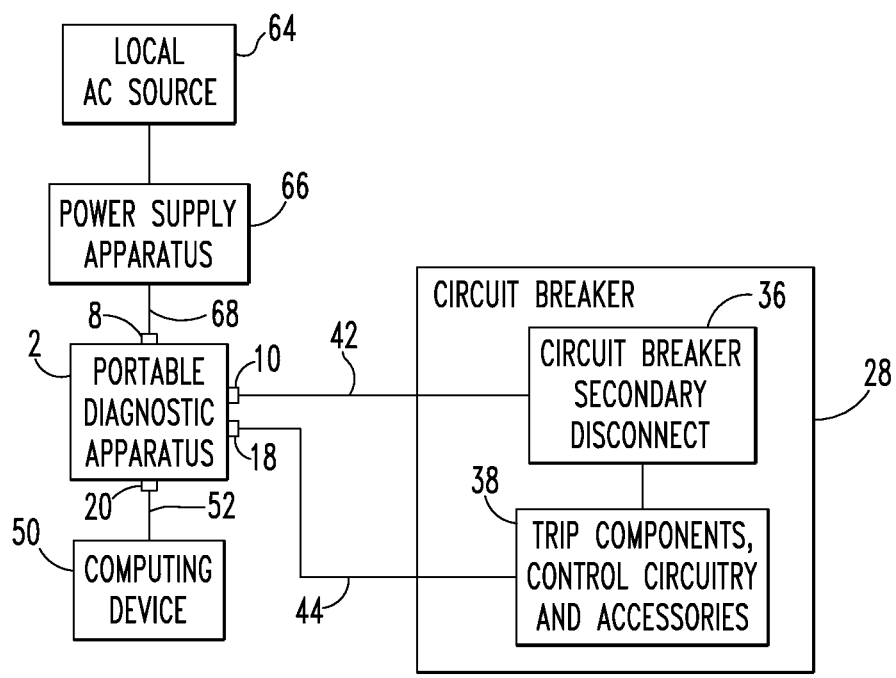
FIG. 6 is a schematic diagram illustrating operation of the diagnostic apparatus of FIG. 1 in an off-site mode for performing diagnostic testing on a circuit breaker according to an alternative exemplary embodiment.

FIG. 6 is a schematic diagram illustrating operation of diagnostic apparatus 2 in the off-site mode for performing diagnostic testing on circuit breaker 28 wherein circuit breaker 28 has been removed from switchgear enclosure 26 and taken to a remote site for the diagnostic testing according to an alternative particular exemplary embodiment. The embodiment shown in FIG. 6 is similar to the embodiment shown in FIG. 5, except that in diagnostic apparatus 2, certain of the power electronics functionality provided in power electronics module 16 has been removed therefrom and instead provided in a separate power supply apparatus 66. As seen in FIG. 6, power supply apparatus 66 is coupled to local AC source 64 for receiving AC power therefrom. In addition, power supply apparatus 66 is coupled to input terminal block 8 via cable assembly 68 so that power supply apparatus 66 can provide certain signals to diagnostic apparatus 2. In one embodiment, power supply apparatus 66 is provided with a strong, rigid and bounce resistant cover similar to cover 4. Power supply apparatus 66, in the exemplary embodiment, includes a processor apparatus and an I/O apparatus for controlling operation of power supply apparatus 66 and enabling user input into power supply apparatus 66. For example, the included I/O apparatus may include CLOSE, OPEN buttons on the front panel to perform a CHARGE-CLOSE-CHARGE-OPEN-CLOSE-OPEN sequence as described herein, or any other desired sequence. A power supply apparatus 66 may also contain, for example and without limitation, step up/down transformers, signal conditioning circuitry, rectifying circuitry, a pulsating power generator, and frequency modulation circuitry such that the power functionality provided by power supply apparatus 66 may also include generating power and control signals that simulate the power and control signals of a switchgear to control and operate circuit breaker 28, including any number of circuit breaker accessory devices such as, without limitation, a spring charging motor, a spring release device, a shunt trip device, and/or an undervoltage release device. Those signals, when generated and output by power supply apparatus 66 and provided to diagnostic apparatus 2 are then provided to circuit breaker 28 through circuit breaker secondary disconnect 36 as described herein. Thus, this embodiment, wherein power supply apparatus 66 provides power supply and certain operation logic and diagnostic apparatus 2 provides sensing and diagnostic functionality, provides an alternative configuration wherein circuit breaker 28 may be electrically controlled in order to obtain a time signature for diagnostic purposes as described herein.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A portable diagnostic apparatus for performing diagnostic testing on a circuit breaker, comprising: a number of sensor devices structured to generate a number of sensed parameter signals relating to operation of the circuit breaker during an operational sequence; a number of auxiliary input connectors structured to receive a number of auxiliary data signals from the circuit breaker, the number of auxiliary data signals relating to and being generated in response to the operation of the circuit breaker during the operational sequence; control and diagnostic circuitry structured to control operation of the portable diagnostic apparatus, receive the number of sensed parameter signals and the number of auxiliary data signals, and generate a time signature based on the number of sensed parameter signals and the number of auxiliary data signals, a first input element structured to be selectively connected to a signaling module external to the portable diagnostic apparatus, the signaling module being structured to provide a number of control signals for the circuit breaker, the number of control signals being configured to cause the circuit breaker to perform the operational sequence, the portable diagnostic apparatus being structured to receive the number of control signals through the first input element; and a first output element structured to be selectively connected to the circuit breaker, the first output element being coupled to the first input element within the portable diagnostic apparatus to receive the number of control signals from the first input element, the diagnostic apparatus being structured to provide the number of control signals to the circuit breaker through the first output element, wherein the number of sensor devices are coupled in between the first input element and the first output element to measure the number of control signals.

2. The portable diagnostic apparatus according to claim 1, wherein the circuit breaker is structured to be housed within a switchgear enclosure, the switchgear enclosure including a switchgear secondary disconnect, the circuit breaker including a circuit breaker secondary disconnect, and wherein the first input element is structured to be selectively connected to the switchgear secondary disconnect and the first output element is structured to be selectively connected to the circuit breaker secondary disconnect.

3. The portable diagnostic apparatus according to claim 1, wherein the first output element is structured to be selectively connected to power electronics, the control and diagnostic circuitry and the power electronics being structured to generate a number of second control signals for the circuit breaker, the number of second control signals being configured to cause the circuit breaker to perform the operational sequence, the diagnostic apparatus being structured to provide the number of second control signals to the circuit breaker through the first output element.

4. The portable diagnostic apparatus according to claim 3, further comprising an input apparatus structured to cause the number of control signals to be selectively generated.

5. A portable diagnostic system including the portable diagnostic apparatus according to claim 1 and a power supply apparatus structured to generate a number of second control signals for the circuit breaker, the power supply apparatus being external to the portable diagnostic apparatus, the number of second control signals being configured to cause the circuit breaker to perform the operational sequence, the first input element being structured to be selectively connected to the power supply apparatus to receive the number of second control signals, the first output element structured to receive the number of second control signals from the first input element, the diagnostic apparatus being structured to provide the number of second control signals to the circuit breaker through the first output element.

6. The portable diagnostic system according to claim 5, wherein the power supply apparatus includes an input apparatus structured to cause the number of second control signals to be selectively generated.

7. The portable diagnostic apparatus according to claim 1, further comprising a data connector structured to be selectively coupled to a computing device to enable the time signature to be output to the computing device.

8. The portable diagnostic apparatus according to claim 1, further comprising an output apparatus operatively coupled to the control and diagnostic circuitry, wherein the control and diagnostic circuitry is structured to analyze the time signature and generate a failure code based on the analysis of the time signature, and wherein the output apparatus is structured to output the failure code.

9. The portable diagnostic apparatus according to claim 1, further comprising a power connector structured to be selectively connected to a local AC power source and a power electronics module structured to provide power for the diagnostic apparatus, wherein the power connector is operatively coupled to the power electronics module.

10. The portable diagnostic apparatus according to claim 1, wherein the operational sequence comprises a CHARGE-CLOSE-CHARGE-OPEN-CLOSE-OPEN sequence, a CHARGE-OPEN (continuous signal)—CLOSE sequence for checking trip free operation, or a CHARGE-CLOSE (continuous signal)—CHARGE-OPEN sequence for checking antipump operation.

11. The portable diagnostic apparatus according to claim 1, wherein the number of sensor devices includes a first sensor device structured to measure a first current being provided to a spring charge motor of the circuit breaker and a second sensor device structured to measure a second current being provided to a mechanism for closing the circuit breaker provided as part of the circuit breaker.

12. The portable diagnostic apparatus according to claim 1, wherein the diagnostic apparatus is structured to be selectively operated in (i) an on-site mode wherein the diagnostic apparatus is connected in series between the circuit breaker and the signaling module, and (ii) an off-site mode wherein the diagnostic apparatus is structured to provide simulated signals to the circuit breaker, wherein the simulated signals are configured to cause the circuit breaker to perform the operational sequence.

13. The portable diagnostic apparatus according to claim 12, wherein the simulated signals are generated within the portable diagnostic apparatus.

14. The portable diagnostic apparatus according to claim 12, wherein the simulated signals are generated within a power supply apparatus coupled to the portable diagnostic apparatus.

15. A method of performing diagnostic testing on a circuit breaker, comprising: receiving a number of control signals in a portable diagnostic apparatus from a signaling module external to the portable diagnostic apparatus when the portable diagnostic apparatus is connected in series between the circuit breaker and the signaling module, wherein the number of control signals are configured to cause the circuit breaker perform the operational sequence; employing the portable diagnostic apparatus to causing cause the circuit breaker to perform an the operational sequence by relaying the received number of control signals to the circuit breaker from the portable diagnostic apparatus; employing the portable diagnostic apparatus to generate a number of sensed parameter signals relating to operation of the circuit breaker during the operational sequence, wherein sensed parameter signals are generated from the number of control signals by sensing the number of control signals; receiving in the portable diagnostic apparatus a number of auxiliary data signals from the circuit breaker, the number of auxiliary data signals relating to and being generated in response to the operation of the circuit breaker during the operational sequence; and generating in the portable diagnostic apparatus a time signature based on the number of sensed parameter signals and the number of auxiliary data signals.

16. The method according to claim 15, wherein the signaling module comprises a switchgear enclosure and a switchgear secondary disconnect.

17. The method according to claim 15, wherein the signaling module is a portable power supply apparatus external to the portable diagnostic apparatus, the portable power supply apparatus having generated the number of control signals.

* * * * *